US008652927B2

(12) United States Patent
Malhotra et al.

(10) Patent No.: US 8,652,927 B2
(45) Date of Patent: *Feb. 18, 2014

(54) INTEGRATION OF NON-NOBLE DRAM ELECTRODE

(71) Applicant: Intermolecular, Inc., San Jose, CA (US)

(72) Inventors: Sandra Malhotra, Fort Collins, CO (US); Hanhong Chen, Milpitas, CA (US); Wim Y. Deweerd, San Jose, CA (US); Edward L. Haywood, San Jose, CA (US); Hiroyuki Ode, Higashihiroshima (JP); Gerald Richardson, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/738,510

(22) Filed: Jan. 10, 2013

(65) Prior Publication Data

US 2013/0320495 A1 Dec. 5, 2013

Related U.S. Application Data

(63) Continuation of application No. 13/482,573, filed on May 29, 2012, now Pat. No. 8,530,348.

(51) Int. Cl.
*H01L 21/20* (2006.01)

(52) U.S. Cl.
USPC .......... 438/396; 438/114; 438/151; 438/197; 438/299; 438/330; 257/E21.012

(58) Field of Classification Search
None
See application file for complete search history.

(56) References Cited

U.S. PATENT DOCUMENTS

| 6,218,296 B1 * | 4/2001 | Kwak et al. ................... 438/653 |
| 2006/0006447 A1 * | 1/2006 | Kim et al. ..................... 257/308 |

* cited by examiner

*Primary Examiner* — Kyoung Lee

(57) ABSTRACT

A method for forming a capacitor stack is described. In some embodiments of the present invention, a first electrode structure is comprised of multiple materials. A first material is formed above the substrate. A portion of the first material is etched. A second material is formed above the first material. A portion of the second material is etched. Optionally, the first electrode structure receives an anneal treatment. A dielectric material is formed above the first electrode structure. Optionally, the dielectric material receives an anneal treatment. A second electrode material is formed above the dielectric material. Typically, the capacitor stack receives an anneal treatment.

17 Claims, 14 Drawing Sheets

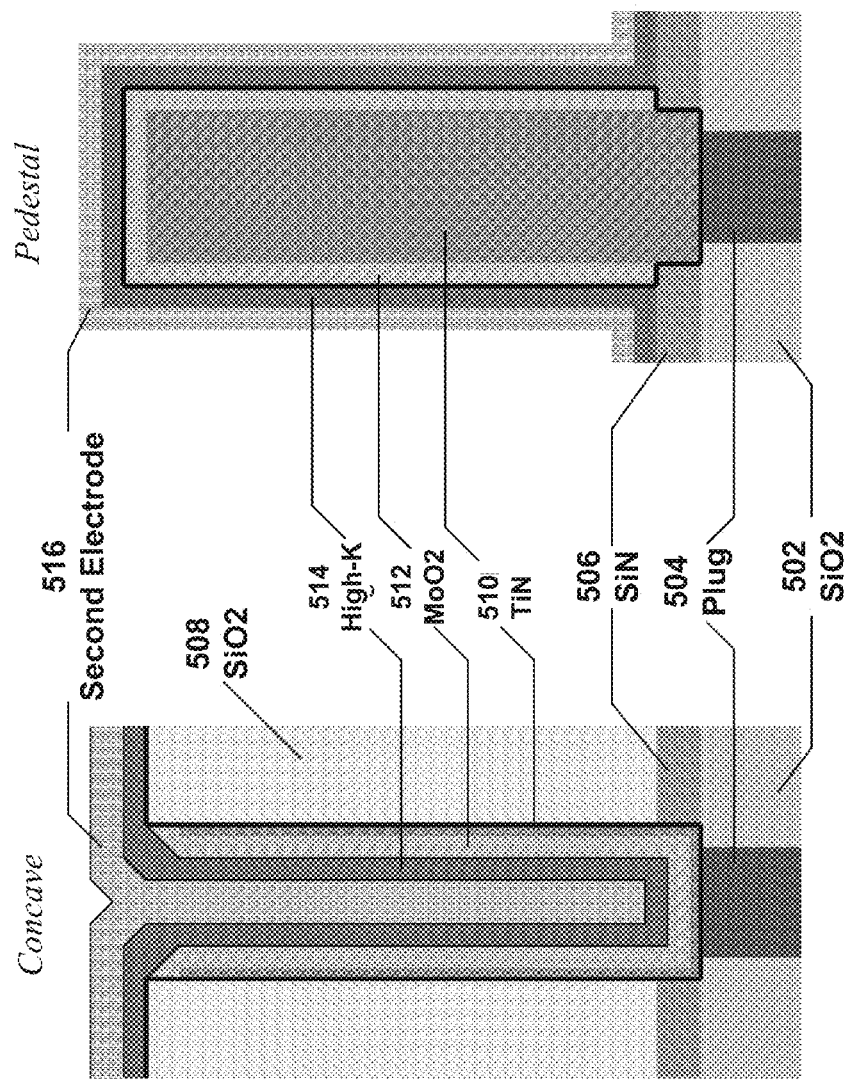

INTEGRATION OF NON-NOBLE DRAM ELECTRODE

CROSS-REFERENCE TO RELATED APPLICATIONS

This is a Continuation Application of U.S. patent application Ser. No. 13/482,573, filed on May 29, 2012, which is herein incorporated by reference for all purposes.

This document relates to the subject matter of a joint research agreement between Intermolecular, Inc. and Elpida Memory, Inc.

FIELD OF THE INVENTION

The present invention relates generally to the field of dynamic random access memory (DRAM), and more particularly to methods of forming a capacitor stack for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally <$10^{-7}$ A cm$^{-2}$). The physical thickness of the dielectric layers in DRAM capacitors cannot be reduced without limit in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. titanium nitride), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k-values greater than about 40. Such materials are generally classified as high-k materials. Representative examples of high-k materials for MIM capacitors are non-conducting metal oxides, non-conducting metal nitrides, non-conducting metal silicates or combinations thereof. These dielectric materials may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium oxide and zirconium oxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Metal compounds such as conductive metal oxides, conductive metal silicides, conductive metal carbides, conductive metal nitrides, or combinations thereof comprise other classes of materials that may be suitable as DRAM capacitor electrodes. Specifically, conductive metal oxides show promise as an electrode material for use in DRAM devices. However, conductive metal oxide materials present a number of challenges during their integration into the fabrication of DRAM devices. For example, i) conductive metal oxides shrink during subsequent annealing steps leading to stress and adhesion issues; ii) the resistivities of conductive metal oxides are not high enough to meet the speed requirements for future DRAM devices; and iii) the composition of conductive metal oxides can change for those metals that have multiple stable binary oxide phases. These issues can be addressed through proper integration of the material into the fabrication of the DRAM device.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Currently, advanced DRAM capacitor stacks comprise a zirconium oxide-based dielectric material. The tetragonal phase of zirconium oxide has a k-value of about 47. However, for future DRAM devices, a dielectric material with a higher k-value must be developed and qualified. Additionally, future DRAM devices will require that the thicknesses of the electrode materials as well as the dielectric materials are reduced so that the areal packing density targets (i.e. number of bits per square micron) can be met for the future devices. Additional specifications such as the resistance of the electrodes and the leakage current through the device must also be met.

Therefore, there is a need to develop methods to fabricate DRAM capacitor stacks that exhibit a high capacitance due to the high k-value of the capacitor dielectric, exhibit low leakage current, and exhibit a low EOT value. Further, there is a need to develop structures and methods to properly integrate conductive metal compounds (specifically conductive metal oxides) into the fabrication of DRAM devices.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a first electrode structure is formed above a substrate. The first electrode structure comprises multiple layers of materials. In some embodiments of the present invention, a first material is formed above the substrate. The first bilayer electrode material is selected to have high conductivity. A second material is formed above the first material. The second material is selected to be conductive and to have a crystalline structure that will promote the formation of the rutile phase of a high-k dielectric material to be formed in a subsequent step. In one example, the first material comprises titanium nitride and the second material comprises molybdenum oxide.

In some embodiments of the present invention, a portion of the first material is etched before the formation of the second material. Additionally, a portion of the second material is etched before the formation of the high-k dielectric material. The double-etch process for the first electrode structure ensures that the first material is not in contact with the high-k dielectric material, resulting in enhanced device performance.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 5A and 5B illustrate simplified cross-sectional views of a DRAM capacitor stack fabricated in accordance with some embodiments of the present invention.

DETAILED DESCRIPTION

Figure 1:
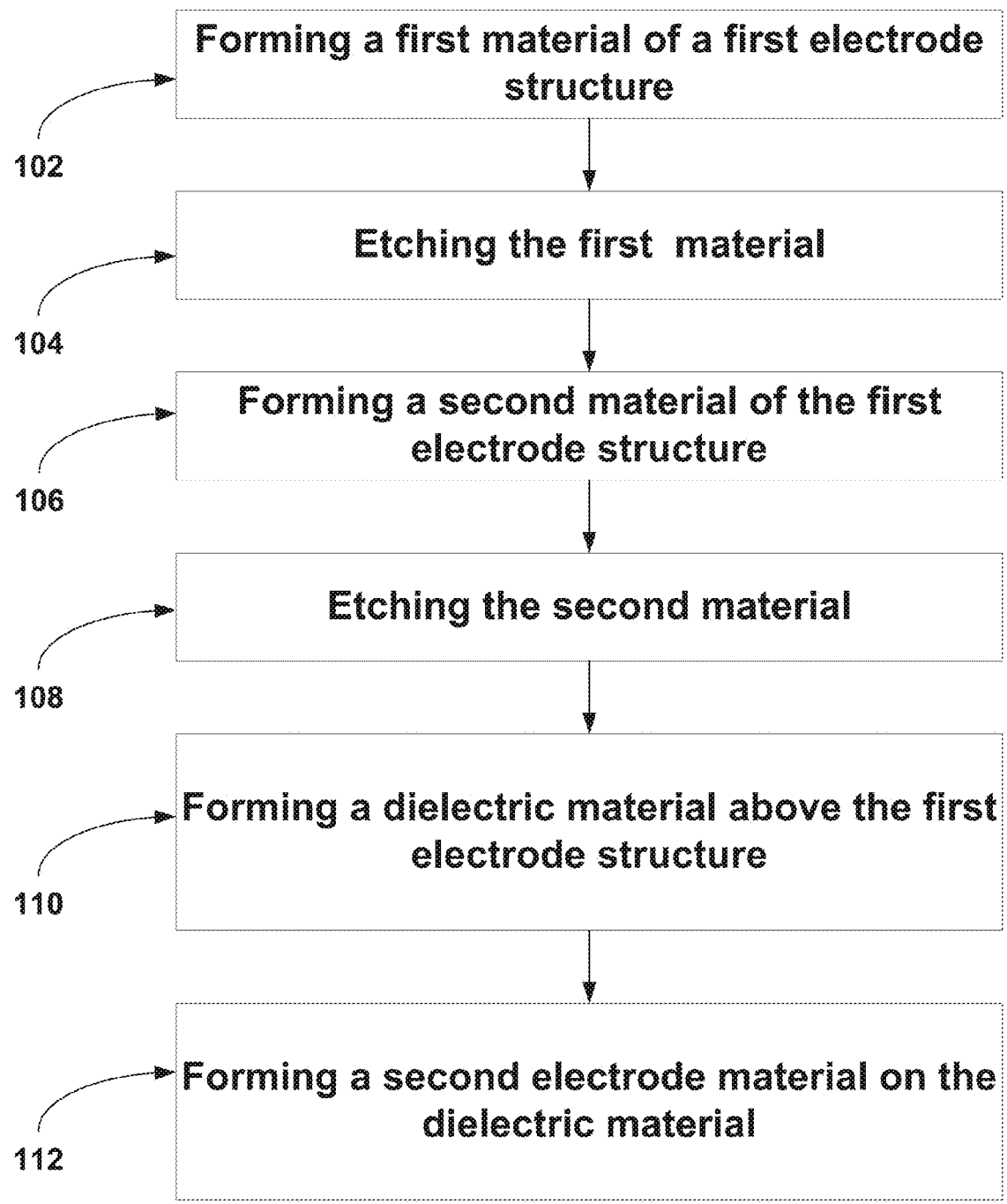
FIG. 1 illustrates a flow chart for the formation of a capacitor stack.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The dielectric constant of a dielectric material is dependent upon the crystalline phase(s) of the material. For example, the cubic and tetragonal phases of zirconium oxide have a higher-k value than the monoclinic phase. So, it is desirable to produce zirconium oxide based DRAM capacitors with the zirconium oxide in the cubic or tetragonal phase. Similarly, in the case of titanium oxide, the anatase crystalline phase of titanium oxide has a dielectric constant of approximately 40, while the rutile crystalline phase of titanium oxide can have a dielectric constant of approximately >80. Due to the higher-k value of the rutile-phase, it is desirable to produce titanium oxide based DRAM capacitors with the titanium oxide in the rutile-phase.

The crystal phase of an adjacent layer can be used to influence the growth of a specific crystal phase of a material if their crystal structures are similar and their lattice constants are similar. This technique is well known in technologies such as epitaxial growth. The same concepts have been extended to the growth of thin films where the adjacent layer can be used as a "template" to encourage the growth of a desired crystalline phase over other competing crystal phases.

Conductive metal oxides, conductive metal silicides, conductive metal carbides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Conductive metal nitrides such as titanium nitride, tantalum nitride, tungsten nitride, etc. have attracted interest as DRAM capacitor electrodes with titanium nitride being the most popular. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of titanium oxide as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode because they act more like insulators and have crystal structures that do not promote the formation of the rutile-phase of titanium oxide. For example, $MoO_3$ (the most oxygen-rich phase) is a dielectric material and has an orthorhombic crystal structure.

DRAM capacitor stacks are formed from a number of deposited thin films. Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the MIM DRAM capacitor stack may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD).

The crystalline phases of dielectric materials exhibit higher-k values than their amorphous phases. Therefore, there is often an optional anneal step either after the dielectric formation step (also known as a post dielectric anneal (PDA)) or an anneal step after the formation of the top electrode (also known as a post metallization anneal (PMA)) to crystallize the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

The amorphous phases of dielectric materials exhibit lower leakage current behavior than the crystalline phases, most likely due to the lower number of defects due to the lack of grain boundaries. Thin films can often be deposited in the amorphous phase by incorporating a high concentration of dopants into the film. As used herein, the dopant may be electrically active or not electrically active. The definition excludes residues and impurities such as carbon, etc. that may be present in the material due to inefficiencies of the process or impurities in the precursor materials.

Figure 2:
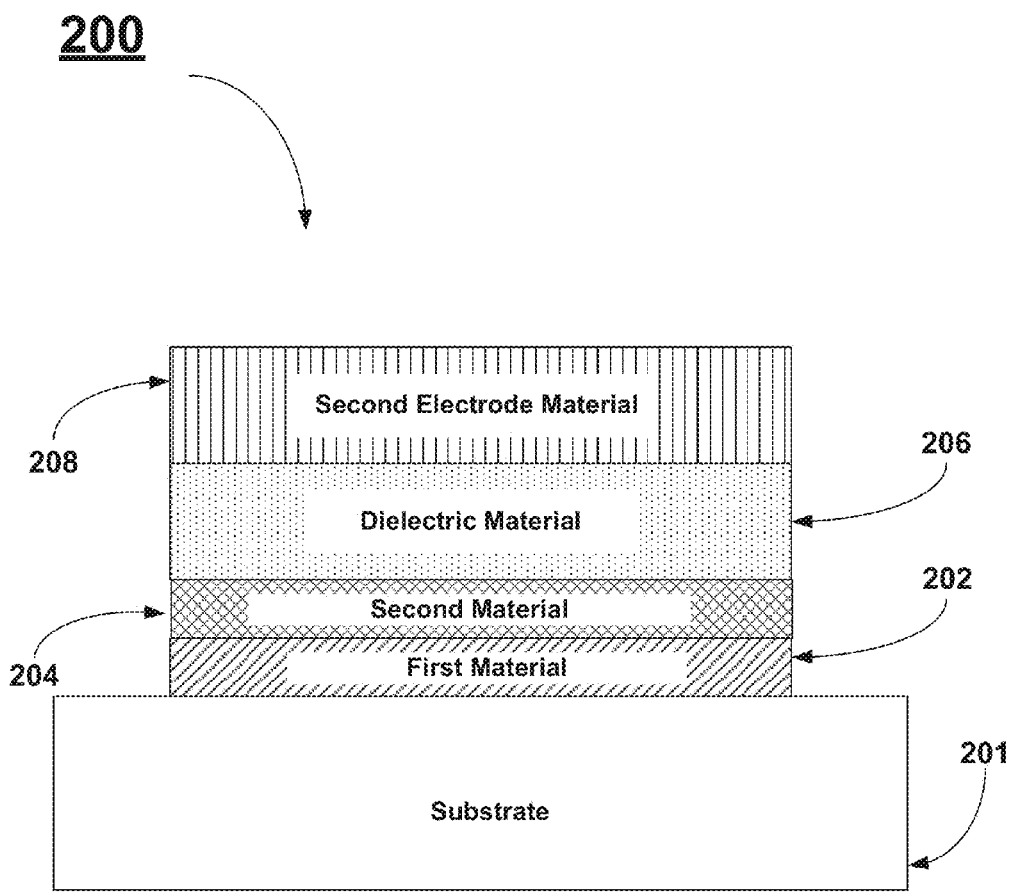
FIG. 2 simplified cross-sectional view of a DRAM capacitor stack fabricated in accordance with some embodiments of the present invention.
Figure 13:
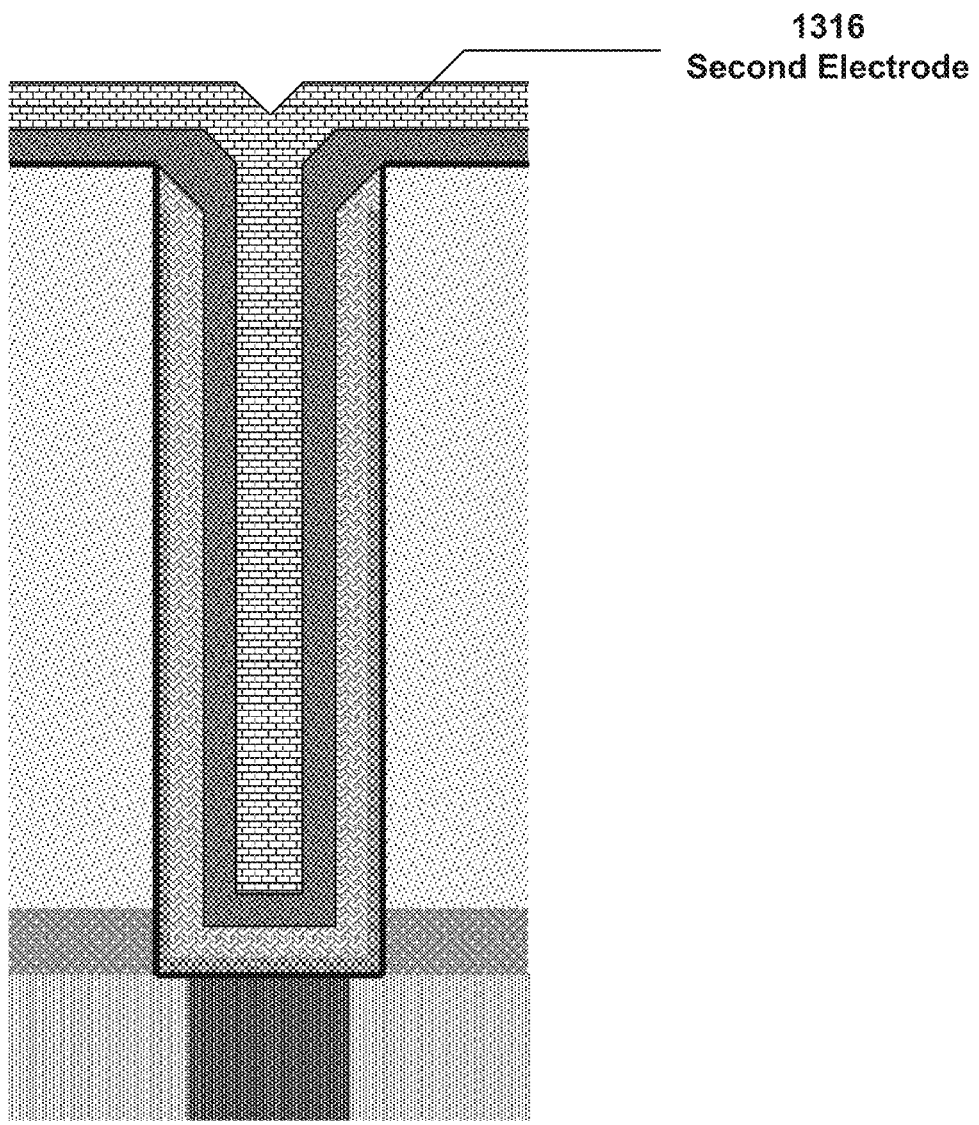
FIG. 13 illustrates a simplified cross-sectional view of a DRAM capacitor stack fabricated in accordance with some embodiments of the present invention.
Figure 14:
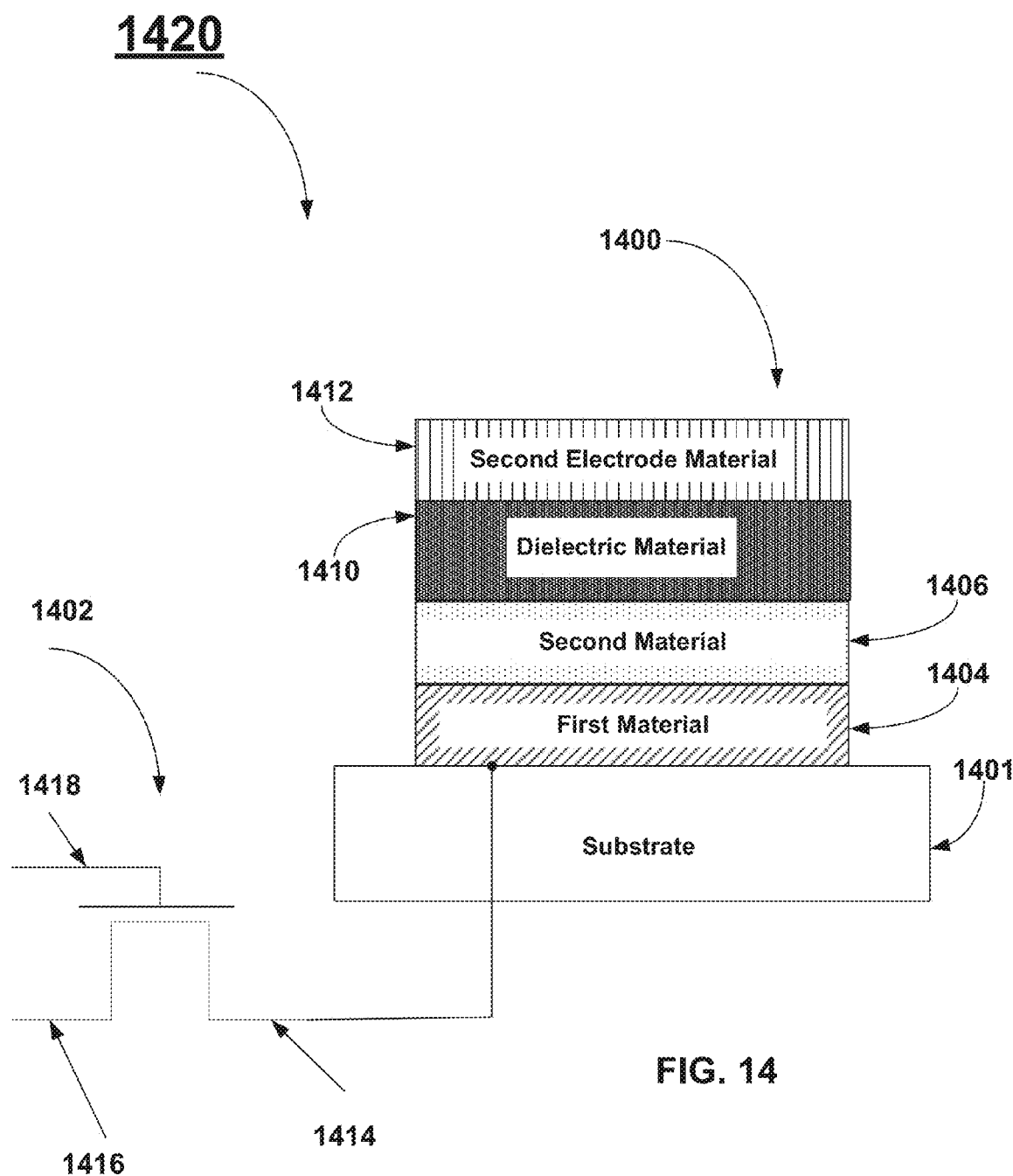
FIG. 14 illustrates a simplified view of a DRAM device fabricated in accordance with some embodiments of the present invention.

In FIGS. 2, and 14 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention. In FIGS. 5-13 below, a capacitor stack is illustrated using a simple concave or pedestal structure. Those skilled in the art will appreciate that the description and teachings to follow can be readily applied to any simple or complex capacitor morphology. The drawings are for illustrative purposes only and do not limit the application of the present invention.

FIG. 1 describes a method, 100, for fabricating a DRAM capacitor stack. Steps 102-108 describe the formation of a first electrode structure. The first electrode structure is comprised of several material layers. The initial step, 102, comprises forming a first material of the first electrode structure above the substrate. Examples of suitable electrode materials comprise metals, conductive metal oxides, conductive metal silicides, conductive metal carbides, conductive metal nitrides, or combinations thereof. Two particularly interesting classes of materials are the conductive metal nitrides and the conductive metal oxides. In step 104, a portion of the first material is etched. In step 106, a second material of the first electrode structure is formed above the etched first material. In step 108, a portion of the second material is etched. The first electrode structure may receive an optional treatment (not shown). In the next step, 110, a dielectric material is formed above the first electrode structure. The dielectric material may comprise a single material or may comprise several materials. The dielectric material may receive an optional PDA treatment (not shown). In the next step, 112, a second electrode material is formed above the dielectric material. The capacitor stack may receive an optional PMA anneal (not shown).

Those skilled in the art will appreciate that each of the first electrode structure (both first and second materials), the dielectric material(s), and the second electrode material used to form the DRAM capacitor may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

FIG. 2 illustrates a simplified cross-sectional view of a DRAM capacitor stack fabricated in accordance with some embodiments of the present invention. This example will use titanium oxide as the dielectric material. However, those skilled in the art will understand that the present methods may be applied to many dielectric materials. As was discussed with respect to FIG. 1, a first electrode structure (202 and 204) will comprise several material layers. First material, 202, of the first electrode structure is formed above substrate, 201. Examples of suitable electrode materials comprise metals, conductive metal oxides, conductive metal silicides, conductive metal carbides, conductive metal nitrides, or combinations thereof. Two particularly interesting classes of materials are the conductive metal nitrides and the conductive metal oxides. The first material is advantageously titanium nitride. As was discussed with respect to FIG. 1, a portion of the first material will be etched (not shown). Second material, 204, of the first electrode structure is formed above first material, 202. Examples of suitable electrode materials comprise metals, conductive metal oxides, conductive metal silicides, conductive metal carbides, conductive metal nitrides, or combinations thereof. Two particularly interesting classes of materials are the conductive metal nitrides and the conductive metal oxides. The second material is advantageously conductive molybdenum oxide. As was discussed with respect to FIG. 1, a portion of the second material will be etched (not shown). This completes the formation of the first electrode structure. The first electrode structure may optionally receive a treatment before the formation of the dielectric material as discussed previously. A dielectric material, 206, is formed above the first electrode structure (202 and 204). Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc., or combinations thereof. Typically, the dielectric material is doped to reduce the leakage current through the device. Examples of dopants for dielectric materials comprise Al, Ce, Co, Er, Ga, Gd, Ge, Hf, In, La, Lu, Mg, Mn, Nd, Pr, Sc, Si, Sn, Sr, Ti, Y, Zr, or combinations thereof. Advantageously, the dielectric material is doped titanium oxide. The dielectric material may optionally receive a PDA treatment as discussed previously. Second electrode material, 208, is then formed above the dielectric material. The capacitor stack may optionally receive a PMA treatment as discussed previously.

When a conductive metal oxide such as molybdenum oxide is used as the second material, it is advantageous that a majority of the layer comprises the high conductivity $MoO_2$ compound and minimizes the presence of $MoO_{2+x}$ compounds. The molybdenum oxide stoichiometry may be influenced by several parameters such as the selection of the molybdenum precursor, the processing conditions, and post-deposition treatments.

As an example, readily available precursors such as molybdenum carbonyl ($Mo(CO_6)$) are not ideal ALD precursors because the molybdenum is in the +6 valence state. This leads to the formation of $MoO_3$ as a primary constituent of the molybdenum oxide material. Molybdenum precursors wherein the molybdenum is in the +4 or +2 valence state are desired because they will preferentially form the desired $MoO_2$ compound. One example of a suitable ALD precursor is cyclopentadienyl molybdenum dicarbonyl 2-methyl-allyl developed by SAFC Hitech, wherein the molybdenum is in the +2 valence state.

An example will be described as an illustration. In some embodiments of the present invention, a first electrode structure is formed from a first material comprising titanium nitride and a second material comprising molybdenum oxide. Each of the titanium nitride material and the molybdenum oxide may be doped to lower the resistivity and/or improve the stability of the material. Each of the titanium nitride material and the molybdenum oxide may be formed using ALD, PE-ALD, AVD, or CVD as discussed previously.

In this example, the titanium nitride first material is formed at a thickness between about 2 nm and about 20 nm using a CVD process. Advantageously, the thickness of the titanium nitride first layer is between about 2 nm and about 6 nm. The CVD process for the formation of the titanium nitride material is typically performed at a temperature between about 400 C and about 500 C, and specifically at about 460 C. The CVD process for the formation of titanium nitride is well known, the details of which have been excluded for brevity.

In this example, the molybdenum oxide second material is formed at a thickness between about 2 nm and about 10 nm using an ALD process. The molybdenum oxide electrode material is formed at a process temperature between about 125 C and 400 C using a molybdenum precursor wherein the molybdenum is in either the +2 or the +4 valence state. The oxidant can be any one of ozone, oxygen, water, etc. Advantageously, the oxidant is ozone. The ozone concentration may be between about 1% and about 20%. Optionally, the substrate with the first electrode structure is then annealed in a reducing atmosphere comprising between about 1% and about 20% hydrogen in nitrogen and advantageously between about 5% and about 10% hydrogen in nitrogen between 300 C and 520 C for between about 1 millisecond and about 60 minutes as discussed previously.

In this example, doped titanium oxide will be used as the dielectric layer. In this example, the dielectric layer comprises between about 6 nm to about 10 nm of titanium oxide wherein at least 30% of the titanium oxide is present in the rutile phase after a subsequent anneal step. Generally, the titanium oxide dielectric layer may either be a single film or may comprise a nanolaminate. Advantageously, the titanium oxide material is doped with Al at a concentration between about 5 atomic % and about 15 atomic % Al. The titanium oxide dielectric layer is formed at a process temperature between about 200 C and 400 C using an ALD process technology. The substrate with the first electrode structure and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In this example, conductive molybdenum oxide will be used as the second electrode material. This has the advantage of forming a symmetrical capacitor stack in that the dielectric material interfaces to the same electrode material on each side of the capacitor. In this example, the molybdenum oxide second electrode material is formed at a thickness between about 2 nm and about 30 nm using an ALD process. The molybdenum oxide second electrode material is formed at a process temperature between about 125 C and 400 C using a molybdenum precursor wherein the molybdenum is in either the +2 or the +4 valence state. The oxidant can be any one of ozone, oxygen, water, etc. Advantageously, the oxidant is ozone. The ozone concentration may be between about 1% and about 20%.

In an alternative example, a second electrode structure comprising two layers may be formed. A first layer, which is in contact with the dielectric layer, may comprise a high work function material such as a metal or conductive metal oxide. It is desirable that the work function of the material in contact with the dielectric layer be at least 5.0 eV. Examples of such a metal oxide second electrode layer include the conductive compounds of chromium oxide, cobalt oxide, iridium oxide, manganese oxide, molybdenum oxide, nickel oxide, rhodium oxide, ruthenium oxide, tungsten oxide, or tin oxide. As an example, the high work function layer may be nickel oxide. The high work function layer has a thickness of between about 1 nm and 10 nm and is typically formed using an ALD or CVD process. A second layer may comprise titanium nitride. Titanium nitride is currently commonly used as the second electrode material in DRAM capacitors. The use of titanium nitride as the second layer makes the integration of the new capacitor stack easier. The titanium nitride layer has a thickness between about 5 nm and about 20 nm and is typically formed using a CVD process as discussed previously.

Figure 3:
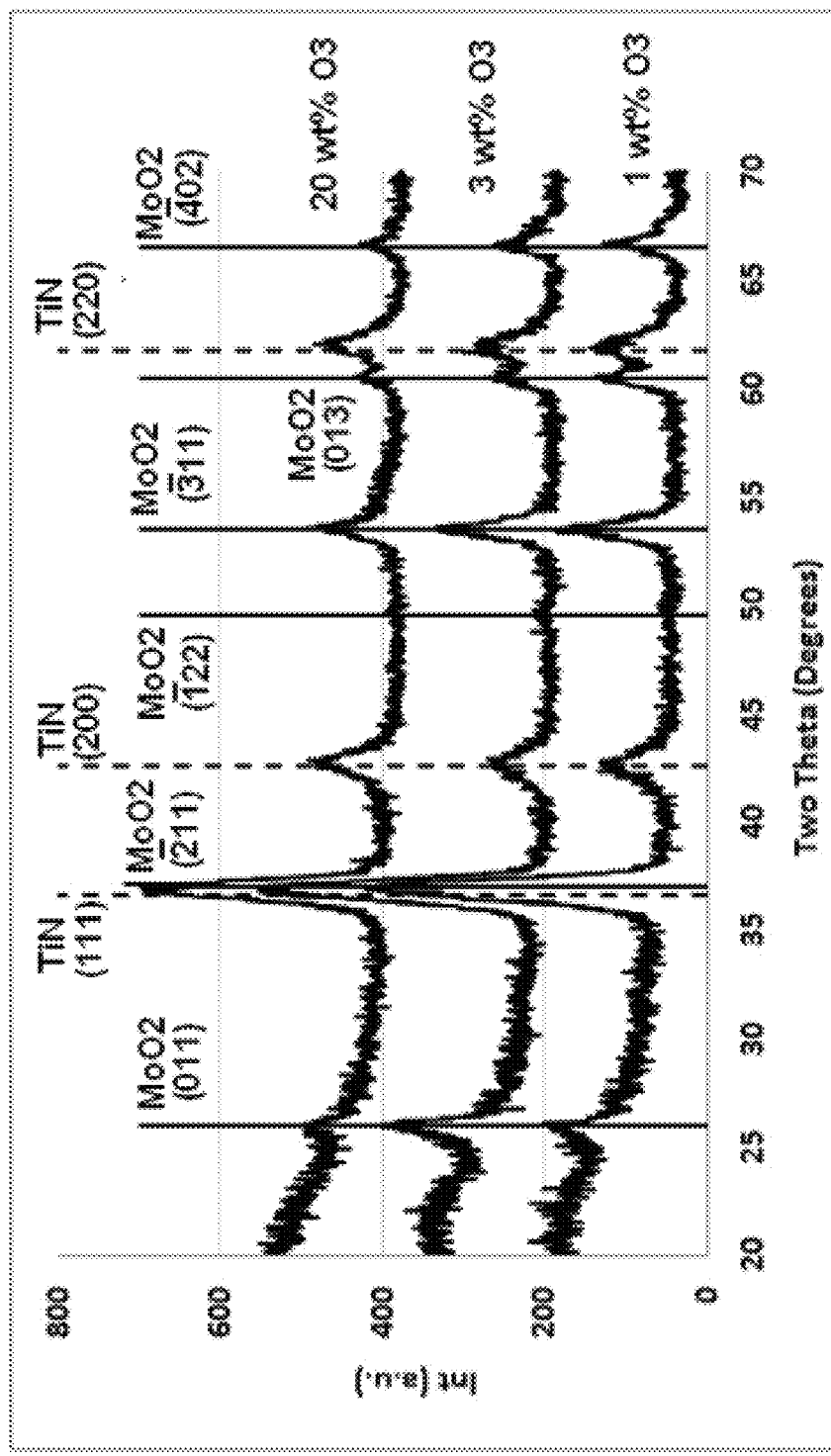
FIG. 3 presents XRD data for a bilayer electrode structure in accordance with some embodiments of the present invention.

FIG. 3 illustrates the impact of process conditions on the composition of the molybdenum oxide. Molybdenum oxide materials of 10 nm were formed above 50 nm titanium nitride layers by ALD using different concentrations of ozone as the oxidant. After a forming gas anneal at 500 C for 10 minutes, the films were characterized using x-ray diffraction (XRD). The anneal treatment of $MoO_x$ materials in forming gas has been found to be particularly beneficial. Details of the forming gas anneal treatment are described in U.S. patent application Ser. No. 13/084,666 entitled "Method for Fabricating a DRAM Capacitor", filed on Apr. 12, 2011, which is herein incorporated by reference. Expected two theta positions for titanium nitride peaks are indicated using dashed lines. Expected two theta positions for $MoO_2$ peaks are indicated using solid lines. The magnitude and the sharpness of the XRD peaks provide a qualitative indication of the degree of crystallization and the uniformity of the crystallization. The XRD data in FIG. 3 indicate that lower concentrations of ozone (i.e. 3% or 1%) are preferred over the higher concentration of 20%. As an example, the (011) peak of $MoO_2$ found at about 26 degrees two theta is larger and sharper for the 1% and 3% ozone films as compared to the 20% ozone film.

Without being bound by theory, it is believed that the film formed using 20% ozone comprises a number of oxygen-rich compounds (I.e. $MoO_{2+x}$) that may not form large crystallites with long range order. This would explain the overall poor crystallinity of this film and the absence of strong diffraction peaks. Additionally, the (011) peak of $MoO_2$ found at about 26 degrees two theta is larger and sharper for the 3% ozone film as compared to the 1% ozone film. Therefore, 3% ozone is an advantageous process condition for the formation of molybdenum oxide in the $MoO_2$ phase.

Figure 4:
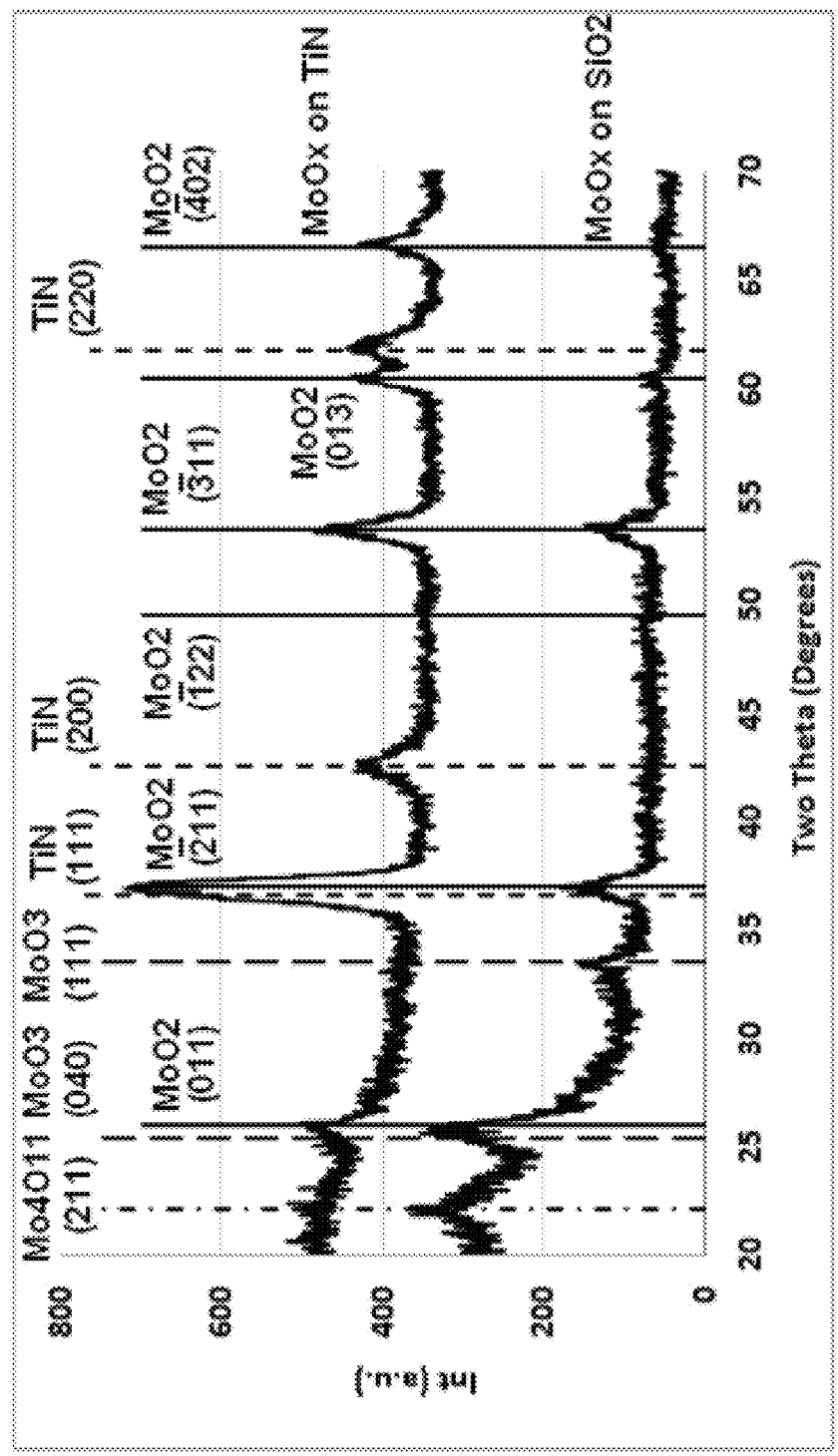
FIG. 4 presents XRD data for a bilayer electrode structure in accordance with some embodiments of the present invention.

FIG. 4 illustrates the impact of the underlying substrate on the composition of the molybdenum oxide. Molybdenum oxide materials of 10 nm were formed above 50 nm titanium nitride layers or 300 nm silicon dioxide layers by ALD using 1% ozone as the oxidant. After a forming gas anneal at 500 C for 10 minutes, the films were characterized using x-ray diffraction (XRD). Expected two theta positions for titanium nitride peaks are indicated using short dashed lines. Expected two theta positions for $MoO_2$ peaks are indicated using solid lines. Expected two theta positions for $MoO_3$ peaks are indicated using long dashed lines. Expected two theta positions for $Mo_4O_{11}$ peaks are indicated using dot-dashed lines. The magnitude and the sharpness of the XRD peaks provide a qualitative indication of the degree of crystallization and the uniformity of the crystallization. Titanium nitride is crystalline and the molybdenum oxide forms above the titanium nitride in the desired $MoO_2$ phase as indicated by the diffraction peaks at about 26 degrees, about 54 degrees, about 61 degrees, and about 67 degrees. Although both $MoO_2$ and $MoO_3$ each have expected diffraction peaks at about 26 degrees, it is believed that this material is primarily $MoO_2$ since there are no other peaks associated with $MoO_3$ (i.e. about 34 degrees) observed for the material. There is no evidence of oxygen-rich crystalline compounds in the molybdenum oxide material formed on the titanium nitride. In contrast, silicon dioxide is amorphous and the molybdenum oxide material formed over the silicon dioxide has a number of oxygen-rich crystalline phases as indicated by the peaks at about 22 degrees ($Mo_4O_{11}$), and about 34 degrees ($MoO_3$). Since both $MoO_2$ and $MoO_3$ each have expected diffraction peaks at about 26 degrees, it is believed that this material is primarily a mixture of the compounds since both $MoO_2$ and $MoO_3$ diffraction peaks are observed for this material. Therefore, titanium nitride is an advantageous underlayer for the formation of molybdenum oxide in the $MoO_2$ phase.

Equation 1 above indicates that the capacitance of a DRAM capacitor cell can be increased by increasing the area of the capacitor plates. However, the desire to provide memory devices with more storage capacity requires that a higher number of capacitor cells be fabricated within the same area of the device. Forming simple planar capacitor structures does not meet this requirement. To meet the shortcomings of the simple planar structure, capacitor structures with complex shapes have been designed. These capacitor structures increase the storage capacity of the capacitor cell (i.e. the capacitance), while increasing the number of capacitors fabricated within the area of the device. Examples of two capacitor structures are illustrated in FIG. 5. In one case, a concave structure is formed by fabricating a hollow cylinder within a thick layer of $SiO_2$. In a second case, a pedestal is formed by fabricating a pillar of titanium nitride above the surface of the substrate. Those skilled in the art will understand that these are simply two examples of a wide variety of capacitor structures and that the present invention is not limited by the details of the capacitor structure.

FIGS. 5A and 5B illustrate simplified cross-sectional views of two DRAM capacitor structures, a "concave" design (5A) and a "pedestal" design (5B). In each case, the capacitor structure is connected to the remainder of the device through a plug, 504, which is formed through silicon dioxide layer, 502. The capacitor cells are isolated from one another in the later direction by a silicon nitride layer, 506. In the case of the concave design, 5A, the hollow cylinder is formed through a silicon dioxide layer, 508. The first material, 510, of the first electrode structure, (510 and 512), is fabricated to form a layer having high conductivity. First material, 510, comprises one of metals, metal alloys, conductive metal oxides, conductive metal nitrides, conductive metal silicides, conductive metal carbides, etc. For this example, first material, 510, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride. A portion of the first material, 510, will be etched before the formation of the second material as will be described below. The second material, 512, of the first electrode structure, (510 and 512), is fabricated to form a layer having the ability to promote the formation of the rutile phase of a high-k dielectric layer (i.e. rutile titanium oxide) to be formed in a subsequent step. Several conductive metal oxides are suitable for this purpose. Examples of such conductive metal oxides include the conductive compounds of chromium oxide, cobalt oxide, iridium oxide, manganese oxide, molybdenum oxide nickel oxide, ruthenium oxide, tin oxide, or tungsten oxide. Specific electrode materials of interest are the conductive metal compounds of molybdenum oxide, tungsten oxide, tin oxide, and cobalt oxide. More specifically, in some embodiments, second material, 512, comprises conductive metal compounds of molybdenum oxide. A portion of the second material, 512, will be etched before the formation of the dielectric material as will be described below. Optionally, the first electrode structure, (510 and 512), may receive an anneal treatment before the formation of subsequent materials. Dielectric material, 514, is formed above the first electrode structure. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc., or combinations thereof. Typically, the dielectric material is doped to reduce the leakage current through the device. Examples of dopants for dielectric materials comprise Al, Ce, Co, Er, Ga, Gd, Ge, Hf, In, La, Lu, Mg, Mn, Nd, Pr, Sc, Si, Sn, Sr, Ti, Y, Zr, or combinations thereof. Advantageously, the dielectric material is doped titanium oxide. Optionally, the dielectric material may receive a PDA anneal treatment as discussed previously. Second electrode material, 516, is formed above the dielectric material. Second electrode material, 516, comprises one of metals, metal alloys, conductive metal oxides, conductive metal nitrides, conductive metal silicides, conductive metal carbides, etc. For this example, second electrode material, 516, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride. Typically, the capacitor stack will then receive a PMA anneal treatment. The various fabrication steps required to form the basic capacitor structures illustrated in FIGS. 5A and 5B are well known and have been omitted for clarity.

Figure 6B:
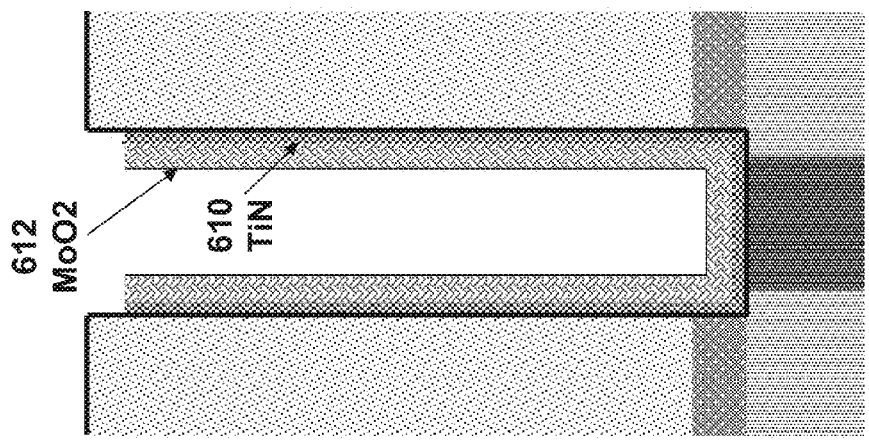
FIGS. 6A and 6B illustrate simplified cross-sectional views of a DRAM capacitor stack fabricated in accordance with some embodiments of the present invention.
Figure 6A:
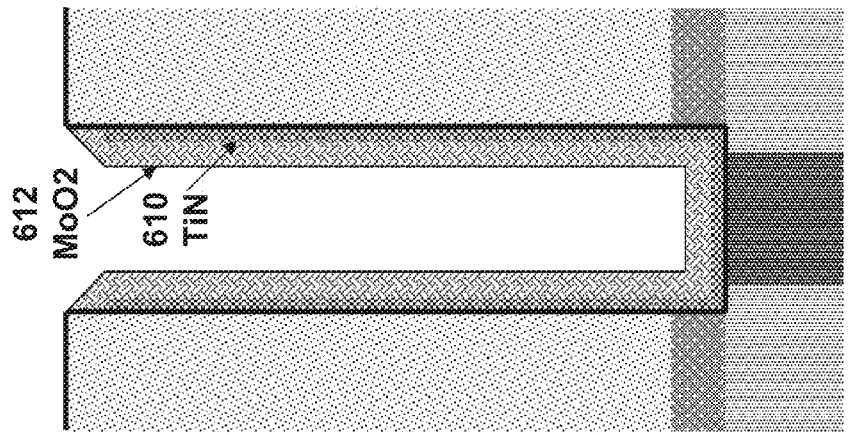

FIGS. 6A and 6B illustrate simplified cross-sectional views of a DRAM capacitor stack fabricated in accordance with some embodiments of the present invention. FIG. 6A illustrates a capacitor cell having the concave structure of FIG. 5A after the etch of the second material of the first electrode structure wherein the first material and the second material each receive a separate etch step. The details of this method will be discussed more completely with regard to FIGS. 7-13 below. In FIG. 6A, titanium nitride has been used as the first material, 610, and molybdenum oxide has been used as the second material, 612. Generally, the second material will have a higher work function than the first material. This improves the performance of the device by lowering the leakage current of the device. In FIG. 6A, the first material (i.e. titanium nitride) is completely covered with the second material (i.e. molybdenum oxide). Therefore, during the subsequent formation of the dielectric material, only the second material, 612, will be in contact with the dielectric material.

FIG. 6B illustrates a capacitor cell having the concave structure of FIG. 5A after a single etch of both the first material and the second material of the first electrode structure. In FIG. 6B, titanium nitride has been used as the first material, 610, and molybdenum oxide has been used as the second material, 612. Generally, the second material will have a higher work function than the first material. This improves the performance of the device by lowering the leakage current of the device. In FIG. 6B, a portion of the first material (i.e. titanium nitride) is exposed after the etch step. Therefore, during the subsequent formation of the dielectric material, a portion of the first material, 610, will be in contact with the dielectric material. This will decrease the performance of the device due to an increase in the leakage current.

Figure 7:
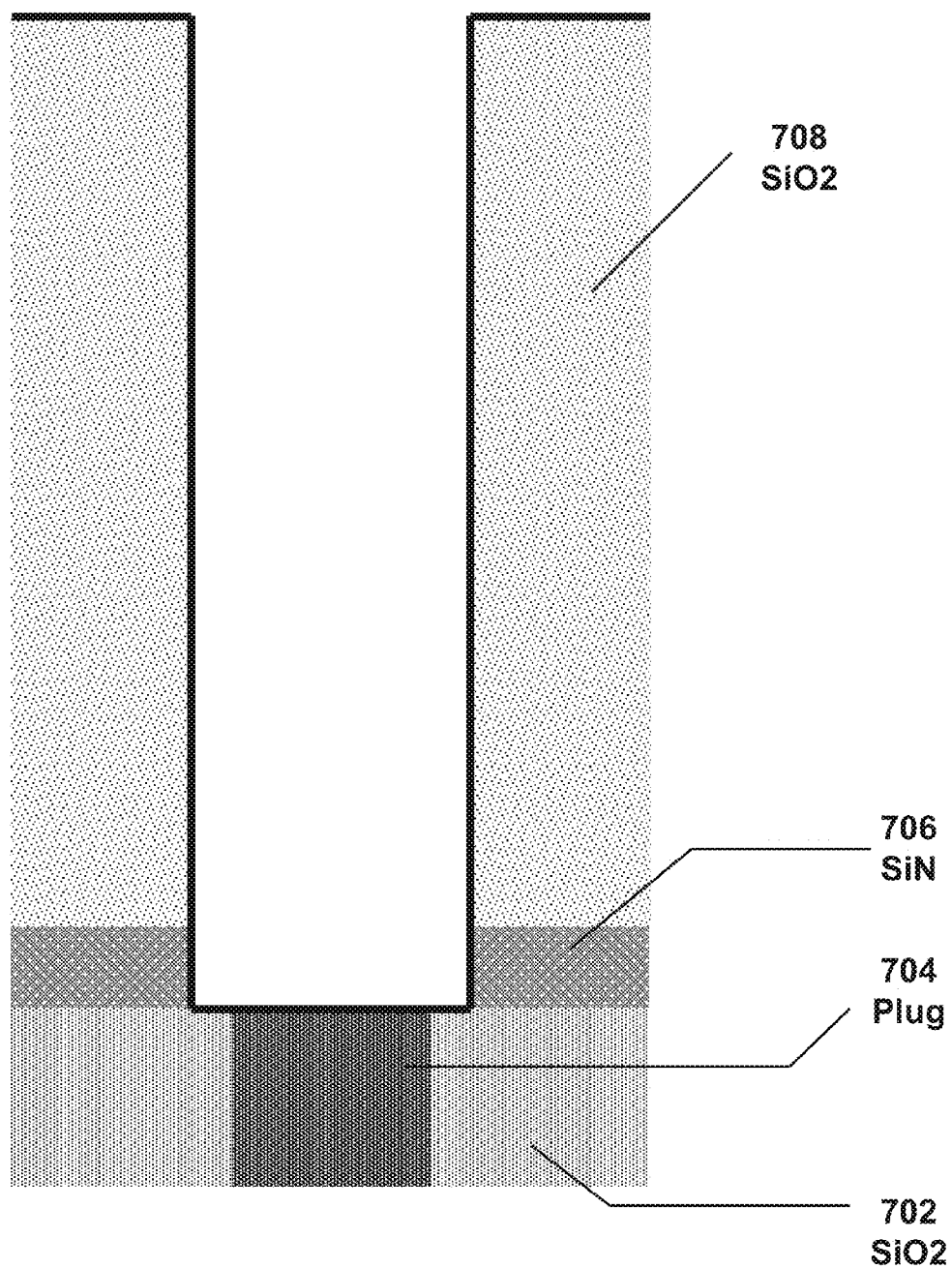
FIG. 7 illustrates a simplified cross-sectional view of a DRAM capacitor stack fabricated in accordance with some embodiments of the present invention.

FIG. 7 illustrates a simplified cross-sectional view of a DRAM capacitor structure fabricated in accordance with some embodiments of the present invention. FIG. 7 illustrates the concave structure of FIG. 5A after the hollow cylinder has been formed in the silicon dioxide material, 708. At this stage of the fabrication of the capacitor cell, the plug, 704, surrounding silicon dioxide layer, 702, and silicon nitride layers, 706, have been previously formed and patterned. This will serve as the beginning structure for the discussion of the method disclosed herein.

Figure 8:
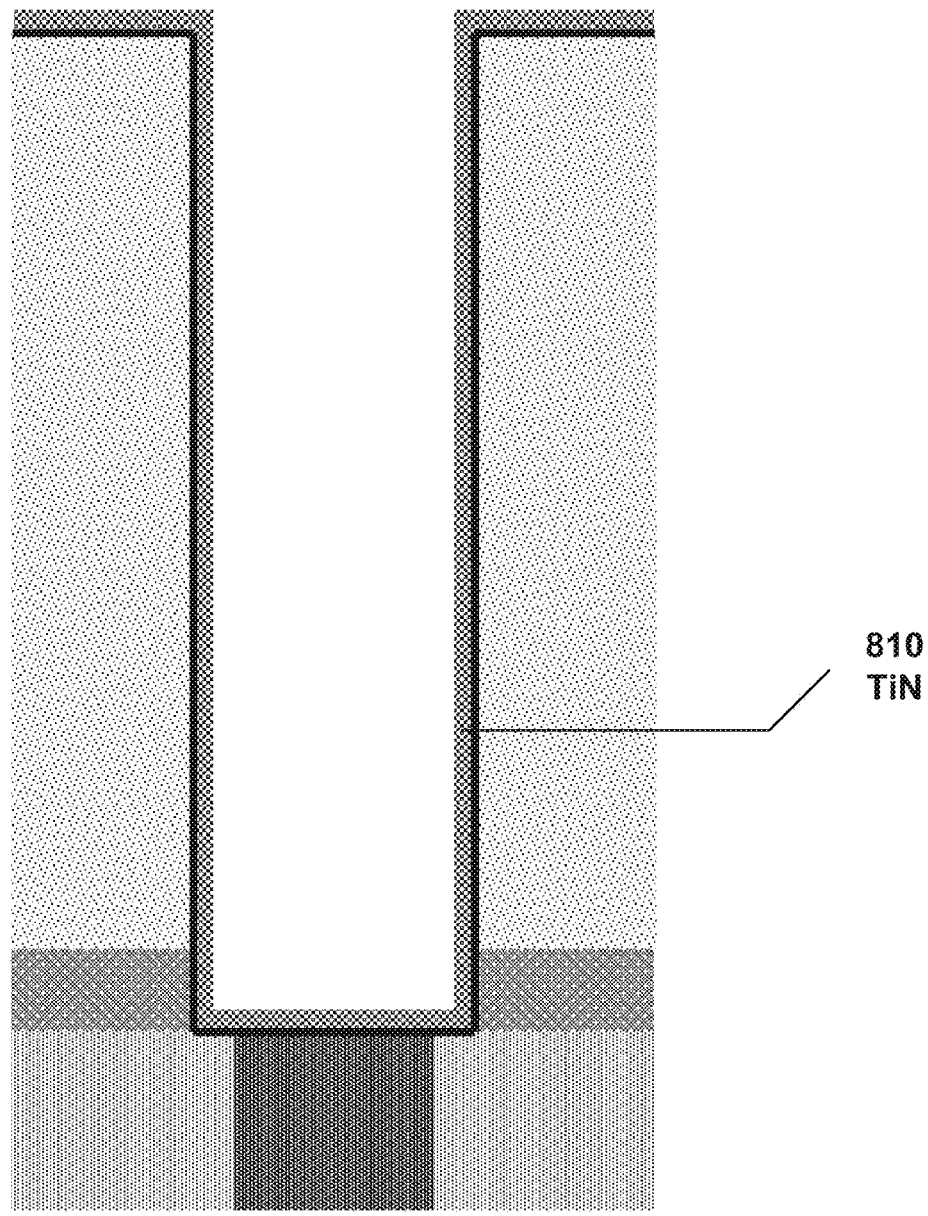
FIG. 8 illustrates a simplified cross-sectional view of a DRAM capacitor stack fabricated in accordance with some embodiments of the present invention.

FIG. 8 illustrates a simplified cross-sectional view of a DRAM capacitor structure fabricated in accordance with some embodiments of the present invention. FIG. 8 illustrates the concave structure of FIG. 7 after the first material, 810, of the first electrode structure, (i.e. 510 and 512 of FIG. 5A), is fabricated to form a layer having high conductivity. First material, 810, comprises one of metals, metal alloys, conductive metal oxides, conductive metal nitrides, conductive metal silicides, conductive metal carbides, etc. For this example, first material, 810, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride. Because of the complex morphology of the DRAM capacitor structure, the first material is typically formed using an ALD, PE-ALD, AVD, or CVD method of formation.

Figure 9:
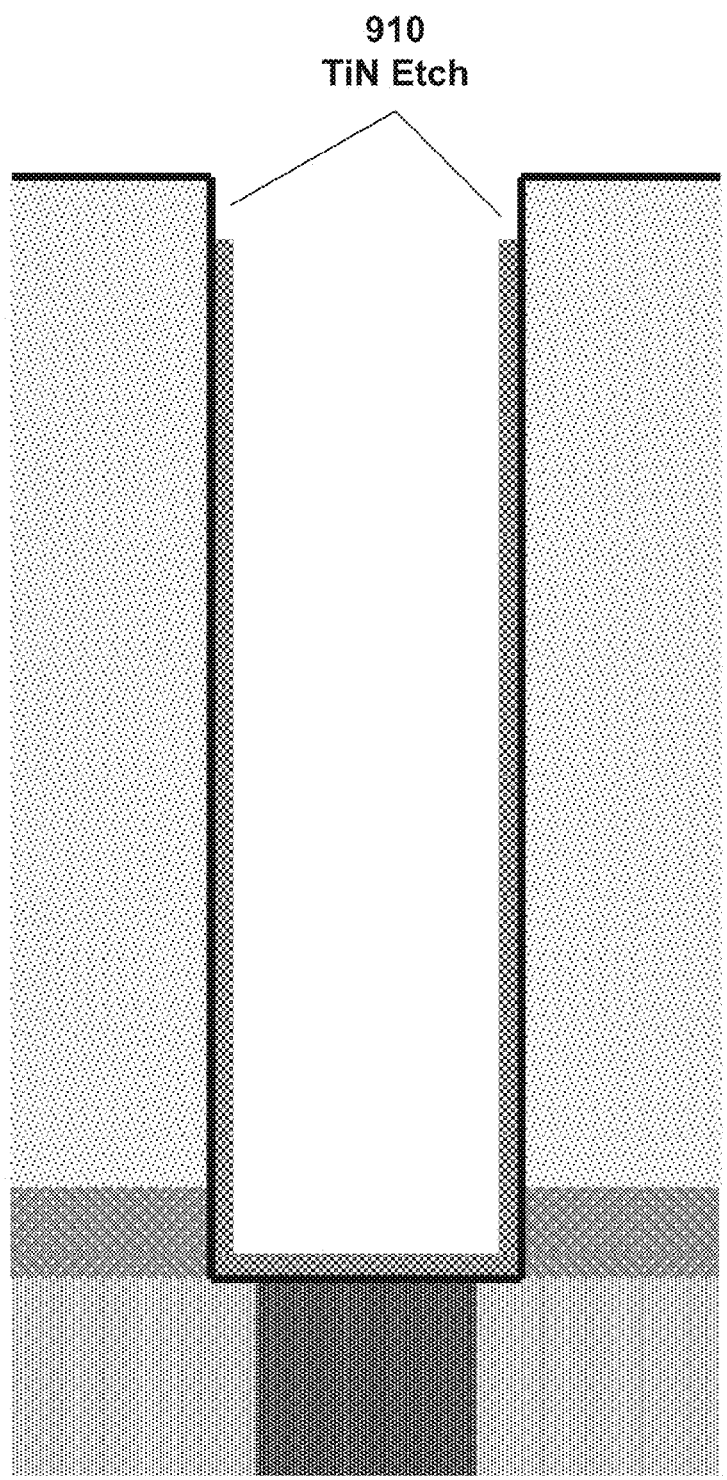
FIG. 9 illustrates a simplified cross-sectional view of a DRAM capacitor stack fabricated in accordance with some embodiments of the present invention.

FIG. 9 illustrates a simplified cross-sectional view of a DRAM capacitor structure fabricated in accordance with some embodiments of the present invention. FIG. 9 illustrates the concave structure of FIG. 8 after a portion the first material has been etched. The etch process may be any well known etch process such as a wet etch, a reactive ion etch, a plasma etch, etc. The etch process leaves a portion of the first material lining the walls and the bottom of the hollow cylinder.

Figure 10:
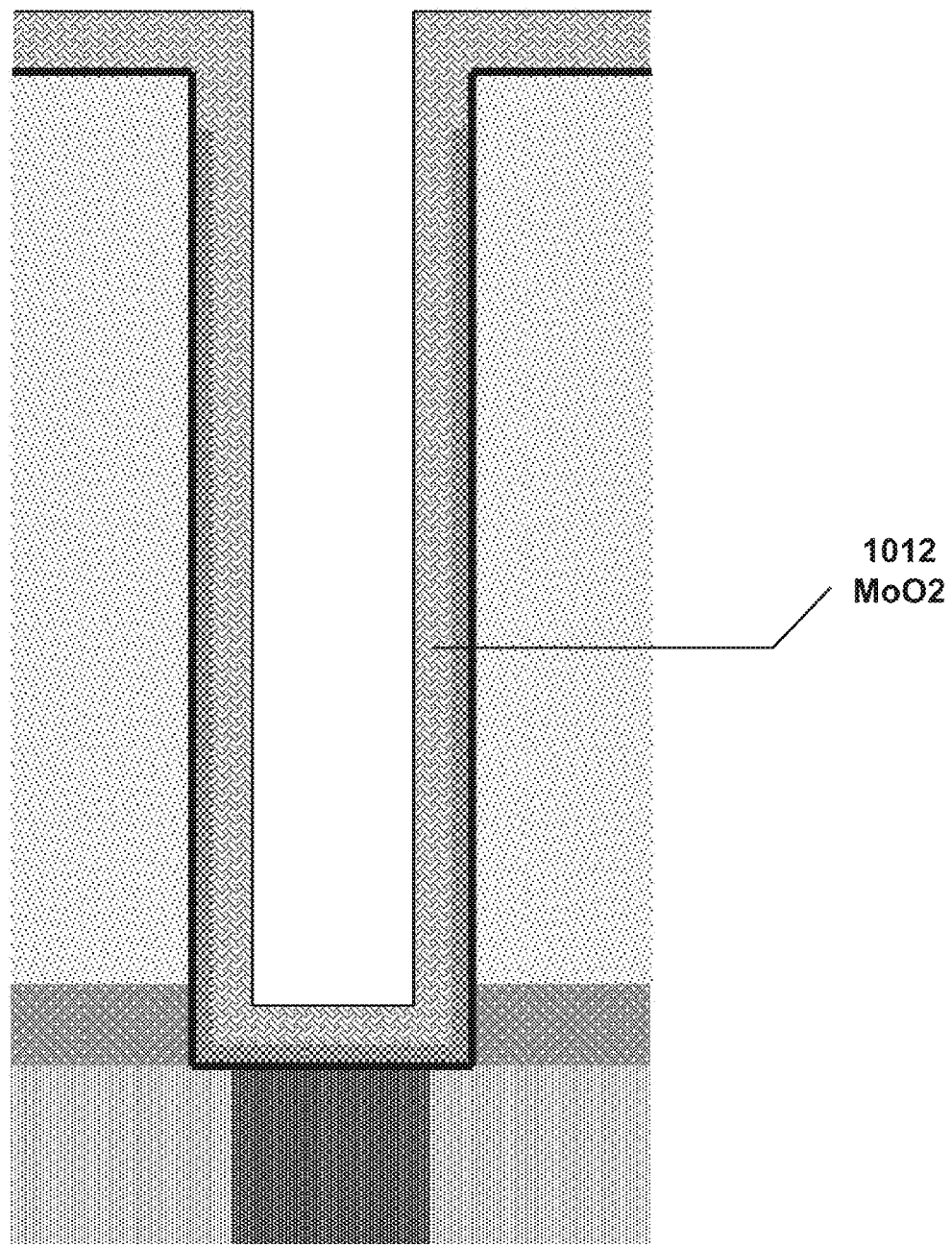
FIG. 10 illustrates a simplified cross-sectional view of a DRAM capacitor stack fabricated in accordance with some embodiments of the present invention.

FIG. 10 illustrates a simplified cross-sectional view of a DRAM capacitor structure fabricated in accordance with some embodiments of the present invention. FIG. 10 illustrates the concave structure of FIG. 9 after the formation of the second material, 1012, of the first electrode structure over the etched first material. The second material completely covers the first material. The second material, 1012, is fabricated to form a layer having the ability to promote the formation of the rutile phase of a high-k dielectric layer (i.e. rutile titanium oxide) to be formed in a subsequent step. Several conductive metal oxides are suitable for this purpose. Examples of such conductive metal oxides include the conductive compounds of chromium oxide, cobalt oxide, iridium oxide, manganese oxide, molybdenum oxide nickel oxide, ruthenium oxide, tin oxide, or tungsten oxide. Specific electrode materials of interest are the conductive metal compounds of molybdenum oxide, tungsten oxide, tin oxide, and cobalt oxide. More specifically, in some embodiments, second material, 1012, comprises conductive metal compounds of molybdenum oxide.

Figure 11:
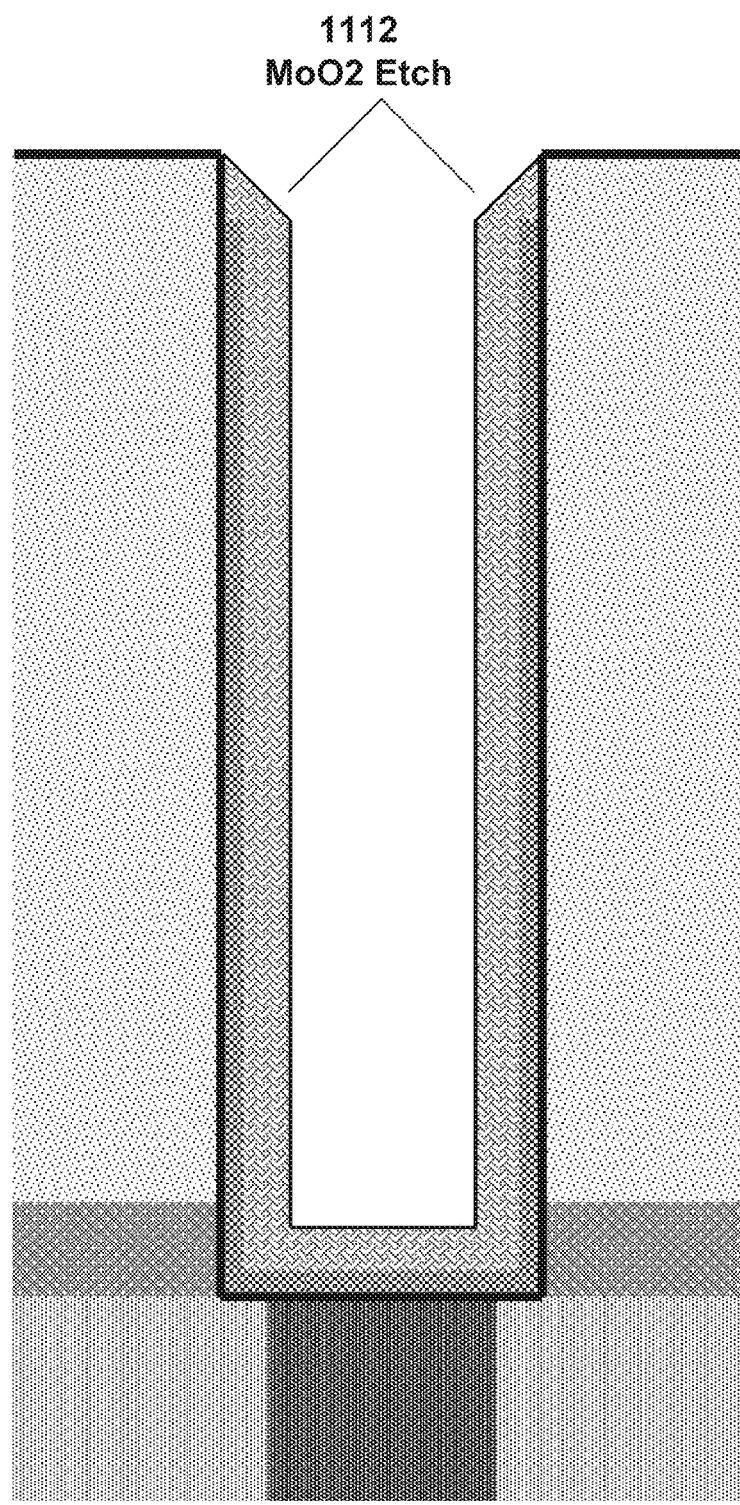
FIG. 11 illustrates a simplified cross-sectional view of a DRAM capacitor stack fabricated in accordance with some embodiments of the present invention.

FIG. 11 illustrates a simplified cross-sectional view of a DRAM capacitor structure fabricated in accordance with some embodiments of the present invention. FIG. 11 illustrates the concave structure of FIG. 10 after a portion the second material has been etched. The etch process may be any well known etch process such as a wet etch, a reactive ion etch, a plasma etch, etc. The etch process leaves a portion of the second material lining the walls and the bottom of the hollow cylinder. After the etch of the second material, there is no portion of the first material that is exposed. Optionally, the first electrode structure may receive an anneal treatment after the etch of the second material.

Figure 12:
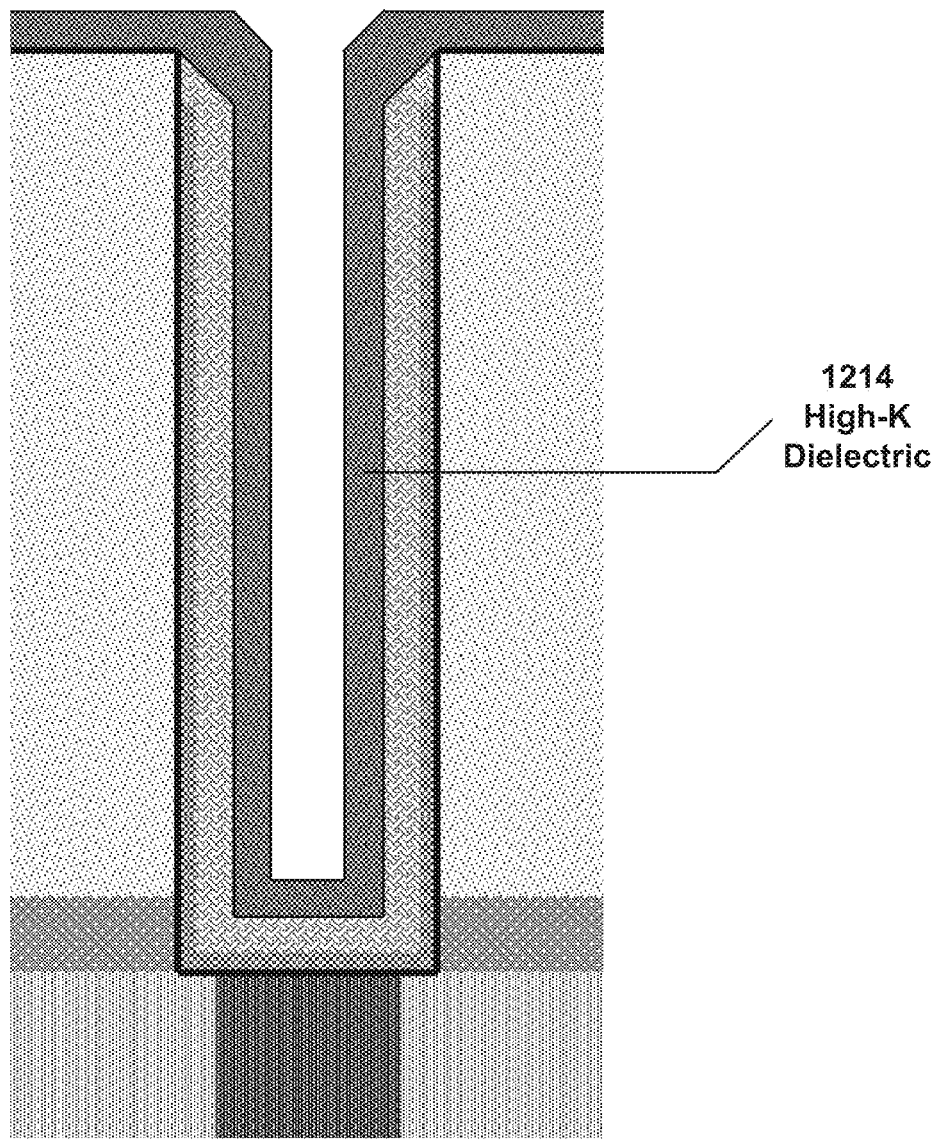
FIG. 12 illustrates a simplified cross-sectional view of a DRAM capacitor stack fabricated in accordance with some embodiments of the present invention.

FIG. 12 illustrates a simplified cross-sectional view of a DRAM capacitor structure fabricated in accordance with some embodiments of the present invention. FIG. 12 illustrates the concave structure of FIG. 11 after the formation of the dielectric material, 1214, over the etched second material. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc., or combinations thereof. Typically, the dielectric material is doped to reduce the leakage current through the device. Examples of dopants for dielectric materials comprise Al, Ce, Co, Er, Ga, Gd, Ge, Hf, In, La, Lu, Mg, Mn, Nd, Pr, Sc, Si, Sn, Sr, Ti, Y, Zr, or combinations thereof. Advantageously, the dielectric material is doped titanium oxide. Optionally, the dielectric material may receive a PDA anneal treatment as discussed previously.

FIG. 13 illustrates a simplified cross-sectional view of a DRAM capacitor structure fabricated in accordance with some embodiments of the present invention. FIG. 13 illustrates the concave structure of FIG. 12 after the formation of the second electrode material, 1316, over the dielectric material. Second electrode material, 1316, comprises one of metals, metal alloys, conductive metal oxides, conductive metal nitrides, conductive metal silicides, conductive metal carbides, etc. For this example, second electrode material, 1316, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride. Typically, the capacitor stack will then receive a PMA anneal treatment.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 14 is used to illustrate one DRAM cell, 1420, manufactured using a structure as discussed previously. The cell, 1420, is illustrated schematically to include two principle components, a cell capacitor, 1400, and a cell transistor, 1402. The cell transistor is usually constituted by a MOS transistor having a gate, 1418, source, 1414, and drain, 1416. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 1400, comprises a first electrode structure comprising multiple materials formed above substrate, 1401. The first material, 1404, of the first electrode structure, (1404 and 1406), is fabricated to form a layer having high conductivity. First material, 1404, comprises one of metals, metal alloys, conductive metal oxides, conductive metal nitrides, conductive metal silicides, conductive metal carbides, etc. For this example, first material, 1404, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride. A portion of the first material, 1404, will be etched before the formation of the second material as was described previously. The second material, 1406, of the first electrode structure, (1404 and 1406), is fabricated to form a layer having the ability to promote the formation of the rutile phase of a high-k dielectric layer (i.e. rutile titanium oxide) to be formed in a subsequent step. Several conductive metal oxides are suitable for this purpose. Examples of such conductive metal oxides include the conductive compounds of chromium oxide, cobalt oxide, iridium oxide, manganese oxide, molybdenum oxide nickel oxide, ruthenium oxide, tin oxide, or tungsten oxide. Specific electrode materials of interest are the conductive metal compounds of molybdenum oxide, tungsten oxide, tin oxide, and cobalt oxide. More specifically, in some embodiments, second material, 1406, comprises conductive metal compounds of molybdenum oxide. A portion of the second material, 1406, will be etched before the formation of the dielectric material as was described previously. Optionally, the first electrode structure, (1404 and 1406), may receive an anneal treatment before the formation of subsequent materials. Dielectric material, 1410, is formed above the first electrode structure. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc., or combinations thereof. Typically, the dielectric material is doped to reduce the leakage current through the device. Examples of dopants for dielectric materials comprise Al, Ce, Co, Er, Ga, Gd, Ge, Hf, In, La, Lu, Mg, Mn, Nd, Pr, Sc, Si, Sn, Sr, Ti, Y, Zr, or combinations thereof. Advantageously, the dielectric material is doped titanium oxide. Optionally, the dielectric material may receive a PDA anneal treatment as discussed previously. Second electrode material, 1412, is formed above the dielectric material. Second electrode material, 1412, comprises one of metals, metal alloys, conductive metal oxides, conductive metal nitrides, conductive metal silicides, conductive metal carbides, etc. For this example, second electrode material, 1412, comprises a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode material of interest is titanium nitride. Typically, the capacitor stack will then receive a PMA anneal treatment.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor layer stack comprising:
    a first material formed over a substrate,
        wherein the first material is a conductive material;
    a second material formed over the etched first material, after a portion of the first material has been etched,
        wherein the second material is a conductive material;
    a third material formed over the etched second material, after a portion of the second material has been etched,
        wherein the third material is a dielectric material; and
    a fourth material formed over the third material,
        wherein the fourth material is a conductive material,
        wherein the third material comprises one of aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or combinations thereof, and
        wherein the third material further comprises a dopant.

2. The semiconductor layer stack of claim 1 wherein the first material comprises one of metals, conductive metal oxides, conductive metal silicides, conductive metal carbides, conductive metal nitrides, or combinations thereof.

3. The semiconductor layer stack of claim 2 wherein the first material comprises a conductive metal nitride.

4. The semiconductor layer stack of claim 3 wherein the conductive metal nitride comprises one of cobalt nitride, molybdenum nitride, nickel nitride, tantalum nitride, titanium nitride, titanium aluminum nitride, tungsten nitride, or combinations thereof.

5. The semiconductor layer stack of claim 4 wherein the conductive metal nitride comprises titanium nitride.

6. The semiconductor layer stack of claim 1 wherein the second material comprises one of metals, conductive metal oxides, conductive metal silicides, conductive metal carbides, conductive metal nitrides, or combinations thereof.

7. The semiconductor layer stack of claim 6 wherein the second material comprises a conductive metal oxide.

8. The semiconductor layer stack of claim 7 wherein the conductive metal oxide comprises one of the conductive compounds of chromium oxide, cobalt oxide, iridium oxide, manganese oxide, molybdenum oxide, nickel oxide, ruthenium oxide, tin oxide, or tungsten oxide.

9. The semiconductor layer stack of claim 8 wherein the conductive metal oxide comprises the conductive compounds of molybdenum oxide.

10. The semiconductor layer stack of claim 1 wherein the dopant comprises Al, Ce, Co, Er, Ga, Gd, Ge, Hf, In, La, Lu, Mg, Mn, Nd, Pr, Sc, Si, Sn, Sr, Ti, Y, Zr, or combinations thereof.

11. The semiconductor layer stack of claim 10 wherein the third material comprises titanium oxide and the dopant comprises Al.

12. The semiconductor layer stack of claim 1 wherein the third material is subjected to an anneal process after the formation of the third material.

13. The semiconductor layer stack of claim 1 wherein the fourth material comprises one of metals, conductive metal oxides, conductive metal silicides, conductive metal carbides, conductive metal nitrides, or combinations thereof.

14. The semiconductor layer stack of claim 1 wherein the fourth material comprises a conductive metal oxide.

15. The semiconductor layer stack of claim 14 wherein the conductive metal oxide comprises one of the conductive compounds of chromium oxide, cobalt oxide, iridium oxide, manganese oxide, molybdenum oxide nickel oxide, ruthenium oxide, tin oxide, or tungsten oxide.

16. The semiconductor layer stack of claim 15 wherein the conductive metal oxide comprises the conductive compounds of molybdenum oxide.

17. A semiconductor layer stack comprising:
    a first material formed over a substrate,
        wherein the first material is a conductive material;
    a second material formed over the etched first material, after a portion of the first material has been etched,
        wherein the second material is a conductive material;
    a third material formed over the etched second material, after a portion of the second material has been etched,
        wherein the third material is a dielectric material; and
    a fourth material formed over the third material,
        wherein the fourth material is a conductive material, and
        wherein the second materials comprises molybdenum oxide.

* * * * *